US006844661B2

(12) United States Patent
Mizuno

(10) Patent No.: US 6,844,661 B2
(45) Date of Patent: Jan. 18, 2005

(54) PIEZOELECTRIC CERAMIC COMPOSITION AND PIEZOELECTRIC ACTUATOR FOR INK-JET HEAD BASED ON USE OF THE SAME

(75) Inventor: Shigeru Mizuno, Nagoya (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 0 days.

(21) Appl. No.: 10/625,747

(22) Filed: Jul. 24, 2003

(65) Prior Publication Data

US 2004/0119378 A1 Jun. 24, 2004

(30) Foreign Application Priority Data

Jul. 29, 2002 (JP) ........................................ 2002-219568

(51) Int. Cl.$^7$ ........................ H01L 41/187; C04B 35/49
(52) U.S. Cl. ............................... 310/358; 252/62.9 PZ; 252/62.9 R; 264/614
(58) Field of Search ....................... 310/258; 264/614; 252/62.9 PZ, 62.9 R; 501/134

(56) References Cited

U.S. PATENT DOCUMENTS

| | | | | |
|---|---|---|---|---|
| 3,963,630 | A | * | 6/1976 | Yonezawa et al. ..... 252/62.9 PZ |
| 5,410,209 | A | * | 4/1995 | Yamashita et al. .......... 310/358 |
| 5,759,433 | A | * | 6/1998 | Sasaki et al. ......... 252/62.9 PZ |
| 6,355,185 | B1 | * | 3/2002 | Kubota ................... 252/62.9 R |
| 6,387,225 | B1 | * | 5/2002 | Shimada et al. ....... 204/192.18 |
| 6,400,064 | B1 | * | 6/2002 | Yamamoto et al. .......... 310/358 |
| 6,451,244 | B1 | * | 9/2002 | Kusumoto et al. ........... 264/614 |
| 6,461,532 | B1 | * | 10/2002 | Oka et al. .............. 252/62.9 R |

FOREIGN PATENT DOCUMENTS

| JP | A 63-225577 | 9/1988 | ........... C04B/35/49 |
|---|---|---|---|
| JP | A 63-285167 | 11/1988 | ........... C04B/35/49 |
| JP | A 64-5973 | 1/1989 | ........... C04B/35/49 |
| JP | A 5-58645 | 3/1993 | ........... C01G/53/00 |
| JP | B1 3044304 | 3/2000 | ......... H01L/41/187 |
| JP | A 2001-302348 | 10/2001 | ........... C04B/35/49 |
| JP | A 2001-302349 | 10/2001 | ......... H01L/41/187 |
| JP | A 2001-302350 | 10/2001 | ......... H01L/41/187 |
| JP | A 2002-226266 | 8/2002 | ......... H01L/41/187 |

* cited by examiner

Primary Examiner—Thomas M. Dougherty
Assistant Examiner—J. Aguirrechea
(74) Attorney, Agent, or Firm—Oliff & Berridge, PLC

(57) ABSTRACT

A piezoelectric ceramic composition comprises a composite perovskite type oxide of $Pb(Ni_{1/3}Nb_{2/3})O_3$ and simple perovskite type oxides of $PbTiO_3$ and $PbZrO_3$ as main components. The composition range of the main components exists in an area surrounded by lines for connecting respective composition points, i.e., a point A (X=40, Y=37, Z=23), a point B (X=36, Y=37, Z=27), a point C (X=33, Y=40, Z=27), and a point D (X=37, Y=40, Z=23) in a triangular coordinate system defined by apexes of $Pb(Ni_{1/3}Nb_{2/3})O_3$, $PbTiO_3$, and $PbZrO_3$, provided that $Pb(Ni_{1/3}Nb_{2/3})O_3$ amounts to X molar %, $PbTiO_3$ amounts to Y molar %, and $PbZrO_3$ amounts to Z molar %. The composition makes it possible to realize a large strain amount while suppressing the relative dielectric constant to be low. The composition is preferably usable for an piezoelectric actuator of an ink-jet head.

8 Claims, 10 Drawing Sheets

PIEZOELECTRIC CERAMIC COMPOSITION AND PIEZOELECTRIC ACTUATOR FOR INK-JET HEAD BASED ON USE OF THE SAME

BACKGROUND OF THE INVENTION

1. Field of the Invention

The present invention relates to a ceramic composition comprising main components of $Pb(Ni_{1/3}Nb_{2/3})O_3$ as a composite perovskite type oxide and $PbTiO_3$ and $PbZrO_3$ as simple perovskite type oxides. In particular, the present invention relates to a piezoelectric ceramic composition which makes it possible to realize a large strain amount while suppressing the relative dielectric constant to be low, and a piezoelectric actuator for an ink-jet head based on the use of such a piezoelectric ceramic composition.

2. Description of the Related Art

In recent years, as the electronic equipment becomes small-sized and intelligent, the piezoelectric ceramic composition becomes more and more important to serve as the solid displacement element to be used for the electronic equipment. At present, a solid solution of $PbTiO_3$—$PbZrO_3$ (hereinafter referred to as "PZT", if necessary), which is a solid solution composed of perovskite type oxides, i.e., $PbTiO_3$ (hereinafter referred to as "PT", if necessary) and $PbzrO_3$ (hereinafter referred to as "PZ", if necessary), is principally used as the piezoelectric ceramic composition.

Further, a solid solution of $Pb(Ni_{1/3}Nb_{2/3})O_3$—$PbTiO_3$—$PbZrO_3$ (hereinafter referred to as "PNN-PT-PZ", if necessary), which is obtained by forming a solid solution of a composite perovskite type oxide, i.e., $Pb(Ni_{1/3}Nb_{2/3})O_3$ (hereinafter referred to as "PNN", if necessary) with the solid solution described above, exhibits a relatively large strain. Therefore, this material attracts the attention as a next generation ceramic actuator material.

According to a reference document ("Handbook of New Actuators for Precise Control", edited by Actuator Research Section of Japan Technology Transfer Association (JTTAS), Fujitec Corporation, 1994), the PNN-PT-PZ solid solution exhibits a relatively large strain (up to 0.12%), and the solid solution exhibits a maximum piezoelectric constant d33 (stain amount with respect to unit voltage) in the vicinity of a composition of 50 molar % PNN-35 molar % PT-15 molar % PZ. Further, it is known that the strain is changed in relation to the peak of the composition of 50 molar % PNN-35 molar % PT-15 molar % PZ in accordance with contour lines having such a certain pattern that the strain is decreased as the distance of separation from the peak is increased.

An ink-jet head, which is carried on an ink-jet printer, includes a piezoelectric type head which is constructed such that a piezoelectric actuator is arranged on a wall surface of an ink cavity, and an ink contained in the ink cavity is discharged from an orifice by utilizing a strain generated when the electric power is applied to the piezoelectric actuator. The piezoelectric ceramic composition, which is composed of the PNN-PT-PZ solid solution as described above, can be used as the piezoelectric actuator of the ink-jet head.

In such a situation, it is important to increase the strain amount of the piezoelectric ceramic composition to be used for the piezoelectric actuator in order to realize the miniaturization of the piezoelectric actuator. Further, it is important to decrease the relative dielectric constant of the piezoelectric ceramic composition in order to realize the energy saving by driving the piezoelectric actuator with a low electric power.

The PNN-PT-PZ solid solution exhibits the relatively large strain (up to 0.12%) in the vicinity of the composition of 50 molar % PNN-35 molar % PT-15 molar % PZ. However, the relative dielectric constant is 5900 which is large. As a result, the input electric energy, which is used to effect the high speed response of the piezoelectric actuator, is also increased. Such a phenomenon is not necessarily preferred for the head-driving circuit even when the strain amount of the piezoelectric actuator is large with respect to the electric field. For example, a problem arises such that the head-driving circuit is large-sized.

SUMMARY OF THE INVENTION

The present invention has been made in order to dissolve the problems involved in the conventional technique as described above, an object of which is to provide a piezoelectric ceramic composition which makes it possible to bring about a large strain amount while suppressing the relative dielectric constant, and a piezoelectric actuator which is composed of such a piezoelectric ceramic composition and which is preferably usable for a variety of ways of use, especially for an ink-jet head.

According to a first aspect of the present invention, there is provided a piezoelectric ceramic composition comprising $Pb(Ni_{1/3}Nb_{2/3})O_3$, $PbTiO_3$, and $PbZrO_3$, wherein:

a composition of $Pb(Ni_{1/3}Nb_{2/3})O_3$, $PbTiO_3$, and $PbZrO_3$ exists in an area in a triangular coordinate system defined by apexes of $Pb(Ni_{1/3}Nb_{2/3})O_3$, $PbTiO_3$, and $PbZrO_3$, the area being surrounded by lines for connecting a point A (X=40, Y=37, Z=23), a point B (X=36, Y=37, Z=27), a point C (X=33, Y=40, Z=27), and a point D (X=37, Y=40, Z=23), when $Pb(Ni_{1/3}Nb_{2/3})O_3$, amounts to X molar %, $PbTiO_3$ amounts to Y molar %, and $PbZrO_3$ amounts to Z molar % (X+Y+Z=100). The present inventors have found out that the peak values having large strains exist in the area which resides in the PNN-PT-PZ solid solution. For example, the piezoelectric displacement d33, which is obtained when a DC electric field of 1 kV/mm is applied in the same direction as that of a polarization axis of the piezoelectric ceramic composition, is not less than 750 pm/V. Further, it has been found out that the relative dielectric constant is within a low range of 3550 to 1700 so long as the composition is included in the area.

In particular, in order to further increase the strain, it is preferable that the composition of $Pb(Ni_{1/3}Nb_{2/3})O_3$, $PbTiO_3$, and $PbZrO_3$ exists in an area surrounded by lines for connecting a point E (X=38, Y=38, Z=24), a point F (X=36, Y=38, Z=26), a point G (X=35, Y=39, Z=26), and a point H (X=37, Y=39, Z=24). The strain is further increased when the piezoelectric ceramic composition is composed of only $Pb(Ni_{1/3}Nb_{2/3})O_3$, $PbTiO_3$, and $PbZrO_3$.

When the composition of the present invention is used for the way of use of actuators and sensors, the composition may further contain La in a ratio of 0.3 to 0.5% by weight as calculated by conversion into an oxide represented by $La_2O_3$. In this case, it is possible to lower the mechanical quality factor (Q value) of the actuator and the sensor.

According to a second aspect of the present invention, there is provided a piezoelectric actuator which is formed of the piezoelectric ceramic composition of the present invention. The actuator of the present invention has a high degree of high speed response performance, and the actuator consumes less electric power, because the actuator is formed by using the composition of the present invention.

According to a third aspect of the present invention, there is provided an ink-jet head comprising the piezoelectric actuator of the present invention and a cavity plate. The ink-jet head makes it possible to perform high speed printing, the ink-jet head consumes less electric power, and the ink-jet head can be miniaturized, because the ink-jet head uses the piezoelectric actuator of the present invention.

BRIEF DESCRIPTION OF THE DRAWINGS

FIG. 6 shows schematic structures of a driving electrode and an ink pressure chamber of the ink-jet printer head, wherein

DESCRIPTION OF THE PREFERRED EMBODIMENTS

Figure 1:
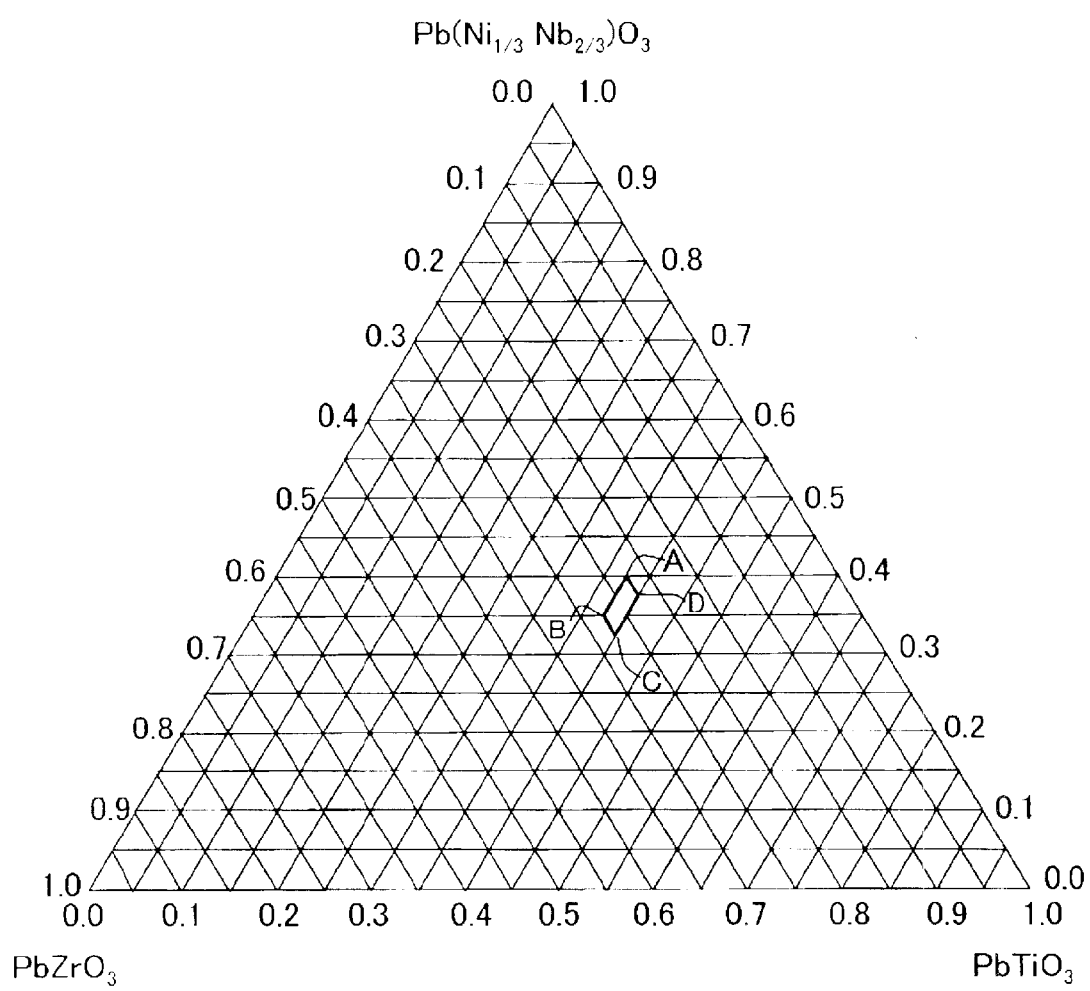
FIG. 1 illustrates a composition area of a piezoelectric ceramic composition according to an embodiment of the present invention as represented by a triangular coordinate system.

An explanation will be made below with reference to FIG. 1 about a piezoelectric ceramic composition according to an embodiment in which the present invention is embodied. FIG. 1 illustrates a composition area of the piezoelectric ceramic composition according to the embodiment of the present invention as represented by a triangular coordinate system.

As shown in FIG. 1, main components of the piezoelectric ceramic composition according to this embodiment reside in a range including lines for connecting respective composition points of Point A (X=40 molar %, Y=37 molar %, Z=23 molar %), Point B (X=36 molar %, Y=37 molar %, Z=27 molar %), Point C (X=33 molar %, Y=40 molar %, Z=27 molar %), and Point D (X=37 molar %, Y=40 molar %, Z=23 molar %) and an area surrounded by the four points.

In the piezoelectric ceramic composition of this embodiment having the composition as described above, the piezoelectric displacement d33, which is obtained when a DC electric field of 1 kV/mm is applied in the same direction as that of the polarization axis thereof, is not less than 750 pm/V. Thus, it is possible to obtain a high degree of strain amount. The relative dielectric constant of the piezoelectric ceramic composition having the composition described above at 1 kHz is within a range of 3550 to 1700. The value of the relative dielectric constant is maintained to be considerably low values.

La may be contained in a ratio of 0 to 0.5% by weight (except for 0) as calculated by conversion into an oxide represented by $La_2O_3$ with respect to the main components of the piezoelectric ceramic composition described above. Accordingly, the mechanical quality factor (Qm) can be lowered while the high piezoelectric displacement d33 of not less than 750 pm/v is maintained and the value of the relative dielectric constant is maintained within the low value range described above. Accordingly, when a piezoelectric actuator for an ink-jet head is formed of the piezoelectric ceramic composition as described above, the actuator can be driven at a low voltage. Thus, it is possible to miniaturize the head-driving circuit.

When the piezoelectric ceramic composition according to this embodiment is formed, starting materials of lead oxide (PbO), nickel oxide (NiO), niobium oxide ($Nb_2O_5$), titanium oxide ($TiO_2$), and zirconium oxide ($ZrO_2$) are used. As for these materials, only lead oxide is weighed in an excessive amount, and the other oxides are weighed so that the stoichiometric ratio of the desired composition is obtained. The additive is weighed with respect to the total amount of the composition to be obtained after the sintering. After mixing the materials, the mixture is formed to have an appropriate form such as a tablet or a prism, and the heat treatment is performed preferably for 1 to 2 hours at 950 to 1050° C. in the atmospheric air.

The method for mixing the materials is preferably exemplified by the dry mixing and the wet mixing. The forming method is preferably exemplified by the die press method and the wet press method. The heat treatment method is preferably exemplified by the heat treatment performed in the atmospheric air. However, there is no limitation thereto.

The materials, which have been subjected to the heat treatment as described above, are treated as follows. That is, unreacted matters are dissolved with an aqueous acidic solution, for example, an aqueous acetic acid solution of 1 N. Particles are separated by means of the filtration operation. Subsequently, the obtained particles are formed by using a die press machine, followed by being sintered for 1 to 3 hours at 1200 to 1260° C. in a PbO atmosphere or in the atmospheric air to prepare a sintered product. The sintering means is exemplified, for example, by the ordinary sintering method and the pressurizing sintering method. However, there is no limitation thereto.

Next, the piezoelectric ceramic composition will be specifically explained on the basis of Examples.

EXAMPLE 1

(1) Starting Materials

Lead oxide (PbO), nickel oxide (NiO), niobium oxide ($Nb_2O_5$), titanium oxide ($TiO_2$), and zirconium oxide ($ZrO_2$) were used as starting materials. As for these materials, only lead oxide was weighed in an excessive amount, and the other oxides were weighed so that the stoichiometric ratio of the desired composition was obtained.

(2) Mixing and Heat Treatment

After mixing the respective materials, the mixture was formed to have a form of tablet, and the heat treatment was performed at 1050° C. for 1 hour in the atmospheric air. As for the method for mixing the materials, the dry mixing and the wet mixing were used in combination. The formed product after the heat treatment was treated as follows. That is, unreacted matters were dissolved with an aqueous acetic acid solution of 1 N, and particles were separated by means of the filtration operation, followed by being dried.

(3) Forming and Sintering

Subsequently, the obtained particles were mixed with an appropriate amount of binder to form granules, followed by being formed into a disk having a diameter of 12 mm and a thickness of 2 mm by using a die press machine. After that, the sintering was performed for 3 hours at 1220° C. in the atmospheric air to prepare a sintered product.

(4) Polishing, Electrode Formation, and Polarization Treatment

The disk-shaped sintered product was polished to have a thickness of 1 mm, and then silver electrodes were thermally formed and attached onto both surfaces to perform a polarization treatment for 30 minutes at 2 kV/mm in silicon oil. The polarization treatment was performed in a direction of the axis of rotation of the disk (thickness direction).

(5) Measurement of Piezoelectric Characteristics

Figure 2:
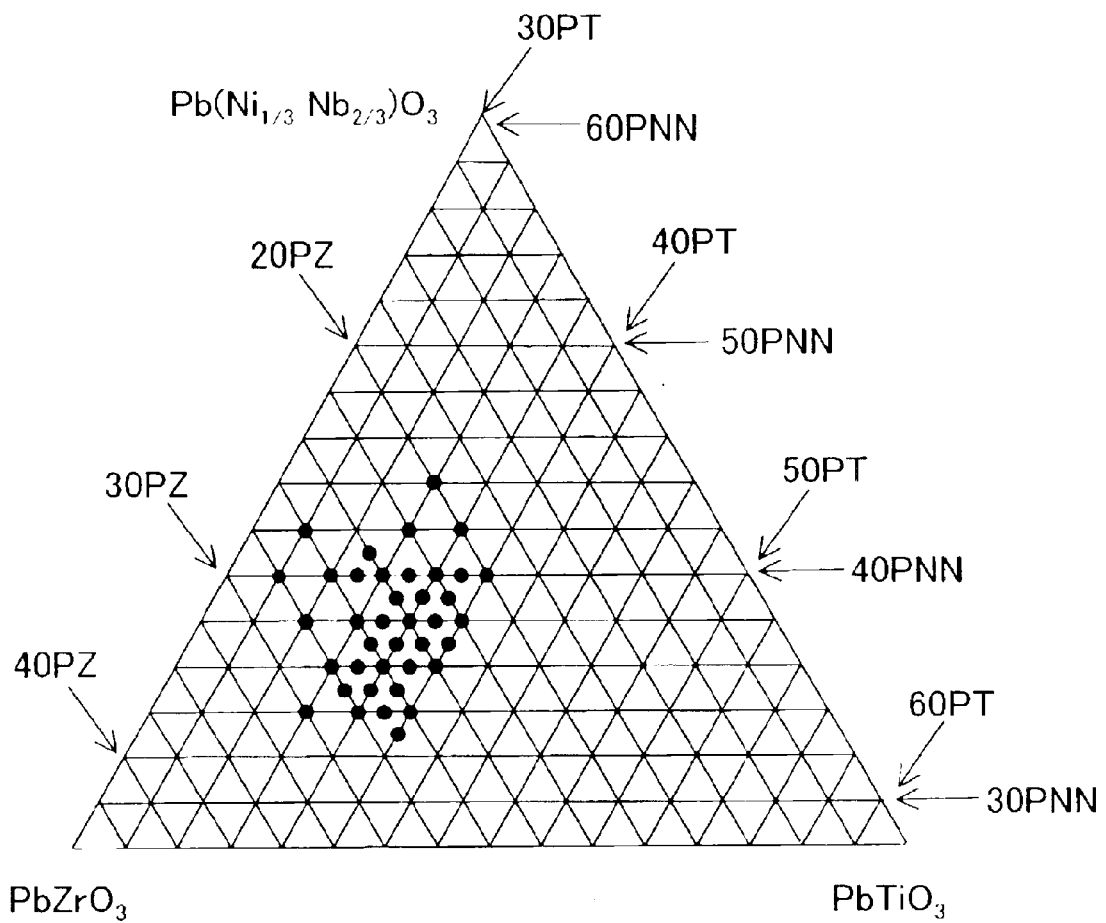
FIG. 2 illustrates compositions corresponding to respective Sample Nos. 1 to 39 as depicted by the triangular coordinate system respectively.

After 24 hours, piezoelectric characteristics of the sintered product obtained as described above were measured by using a laser displacement meter. Obtained results of the measurement are shown in Table 1. In Table 1, the piezoelectric displacement d33, which was obtained when a DC electric field of 1 kV/mm was applied in the same direction as that of the polarization direction, is shown for each of Sample Nos. 1 to 39 having a variety of compositions constructed as described above. The compositions corresponding to Sample Nos. 1 to 39 respectively are shown in the triangular coordinate system in FIG. 2.

TABLE 1

Characteristics of Piezoelectric Ceramic Materials at Respective Composition Points

| Sample No. | Respective components | | | Additive | d33 (1 kV) pm · V$^{-1}$ | Remarks |
|---|---|---|---|---|---|---|
| | X | Y | Z | | | |
| 1 | 44 | 36 | 20 | — | 680 | * |
| 2 | 42 | 38 | 20 | — | 700 | * |
| 3 | 42 | 36 | 22 | — | 660 | * |
| 4 | 42 | 32 | 26 | — | 700 | * |
| 5 | 41 | 35 | 24 | — | 700 | * |
| 6 | 40 | 40 | 20 | — | 620 | * |
| 7 | 40 | 39 | 21 | — | 620 | * |
| 8 | 40 | 38 | 22 | — | 720 | * |
| 9 | 40 | 37 | 23 | — | 820 | |
| 10 | 40 | 36 | 24 | — | 620 | * |
| 11 | 40 | 35 | 25 | — | 660 | * |
| 12 | 40 | 34 | 26 | — | 640 | * |
| 13 | 40 | 32 | 28 | — | 600 | * |
| 14 | 39 | 39 | 22 | — | 640 | * |
| 15 | 39 | 38 | 23 | — | 800 | |
| 16 | 39 | 37 | 24 | — | 780 | |
| 17 | 38 | 40 | 22 | — | 720 | * |
| 18 | 38 | 39 | 23 | — | 800 | |
| 19 | 38 | 38 | 24 | — | 1020 | |
| 20 | 38 | 37 | 25 | — | 770 | |
| 21 | 38 | 36 | 26 | — | 620 | * |
| 22 | 38 | 34 | 28 | — | 600 | * |
| 23 | 37 | 40 | 23 | — | 750 | |
| 24 | 37 | 39 | 24 | — | 820 | |
| 25 | 37 | 38 | 25 | — | 920 | |
| 26 | 37 | 37 | 26 | — | 770 | |
| 27 | 36 | 40 | 24 | — | 750 | |
| 28 | 36 | 39 | 25 | — | 920 | |
| 29 | 36 | 38 | 26 | — | 900 | |
| 30 | 36 | 37 | 27 | — | 750 | |
| 31 | 36 | 36 | 28 | — | 560 | * |
| 32 | 35 | 39 | 26 | — | 800 | |
| 33 | 35 | 38 | 27 | — | 750 | |
| 34 | 35 | 37 | 28 | — | 600 | * |
| 35 | 34 | 40 | 26 | — | 760 | |
| 36 | 34 | 39 | 27 | — | 780 | |
| 37 | 34 | 38 | 28 | — | 660 | * |
| 38 | 34 | 36 | 30 | — | 600 | * |
| 39 | 33 | 40 | 27 | — | 750 | |
| 40 | 37 | 38 | 25 | 0.1 wt % La$_2$O$_3$ | 860 | |
| 41 | 37 | 38 | 25 | 0.3 wt % La$_2$O$_3$ | 900 | |
| 42 | 37 | 38 | 25 | 0.5 wt % La$_2$O$_3$ | 780 | |
| 43 | 37 | 38 | 25 | 1.0 wt % La$_2$O$_3$ | 740 | |

Symbol "*" indicates those outside the scope of the present invention.

Figure 3:
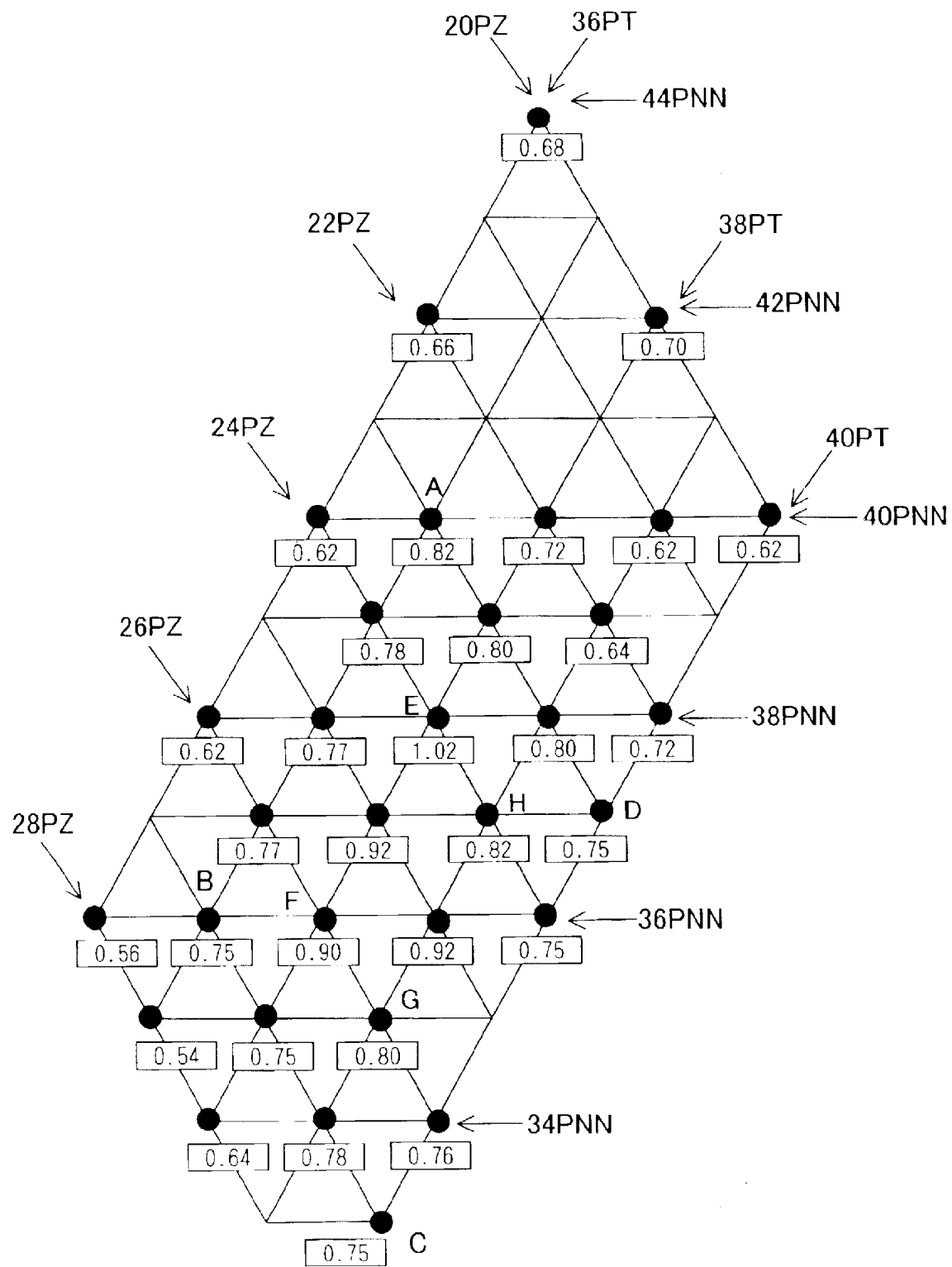
FIG. 3 shows magnified major portions shown in FIG. 2 and illustrates them while adding values of the piezoelectric displacement d33 as calculated by conversion into values of displacement amounts ($\mu$m) per 1 mm at 1 kV corresponding to the respective compositions.

In Table 1, it is appreciated that the peak value (1020 pm/V) of the piezoelectric displacement d33 is obtained with the sample (Sample No. 19) in which the composition of PNN-PT-PZ includes PNN of 38 molar %, PT of 38 molar %, and PZ of 24 molar %. The samples, which exist in the vicinity of the composition including PNN of 38 molar %, PT of 38 molar %, and PZ of 24 molar %, also exhibit relatively high values as the obtained values of the piezoelectric displacement d33. This situation is expressed by the triangular coordinate system as shown in FIG. 3. FIG. 3 shows magnified major portions shown in FIG. 2 and illustrates them while adding values of piezoelectric displacement d33 as calculated by conversion into values of displacement amounts (μm) per 1 mm at 1 kV corresponding to the respective compositions.

As a result of various investigations performed by the present inventors in relation to the results of measurement shown in Table 1 and FIG. 3 while considering, for example, the general characteristics of the piezoelectric ceramic composition, it has been concluded that a value of 750 pm/V is reasonably used as the threshold value of the piezoelectric displacement d33.

In view of the above, the respective samples shown in Table 1 have been examined. As a result, it is appreciated that any one of the values of the piezoelectric displacement d33 obtained with the compositions of Sample Nos. 1 to 8, 10 to 14, 17, 21, 22, 31, 34, 37, and 38 is not more than 750 pm/V, revealing that the values are not more than the threshold value. On the other hand, it is appreciated that the value of the piezoelectric displacement d33 is not less than 750 pm/V (threshold value) in any one of the compositions in the vicinity of the substantial center of the peak value (1020 pm/V) of the piezoelectric displacement d33 obtained in the sample (sample No. 19) including PNN of 38 molar %, PT of 38 molar %, and PZ of 24 molar % on the lines for connecting the respective composition points of Point A (PNN: 40 molar %, PT: 37 molar %, PZ: 23 molar %, Sample No. 9), Point B (PNN: 36 molar %, PT: 37 molar %, PZ: 27 molar %, Sample No. 30), Point C (PNN: 33 molar %, PT: 40 molar %, PZ: 27 molar %, Sample No. 39), and Point D (PNN: 37 molar %, PT: 40 molar %, PZ: 23 molar %, Sample No. 23) and in the area surrounded by the four points. In particular, it is appreciated that the value of the piezoelectric displacement d33 is not less than 800 pm/V (threshold value) in any one of the compositions on the lines for connecting the respective composition points of Point E (PNN: 38 molar %, PT: 38 molar %, PZ: 24 molar %, Sample No. 19), Point F (PNN: 36 molar %, PT: 38 molar %, PZ: 26 molar %, Sample No. 29), Point G (PNN: 35 molar %, PT: 39 molar %, PZ: 26 molar %, Sample No. 29), and Point H (PNN: 37 molar %, PT: 39 molar %, PZ: 24 molar %, Sample No. 24) and in the area surrounded by the four points.

The dielectric characteristics were measured by using an impedance analyzer for the samples having the respective compositions included in the area surrounded by Point A, Point B, Point C, and Point D as described above. As a result, it has been confirmed that the relative dielectric constant at 1 kHz exists in a range of 3550 to 1700 in any one of the compositions, and the value of the relative dielectric constant is maintained to be relatively low values.

As described above, according to the piezoelectric ceramic composition concerning Example 1, it is possible to realize the large strain amount in which the piezoelectric displacement d33 is not less than 750 pm/V while suppressing the relative dielectric constant to be low within the range of 3550 to 1700.

Figure 4:
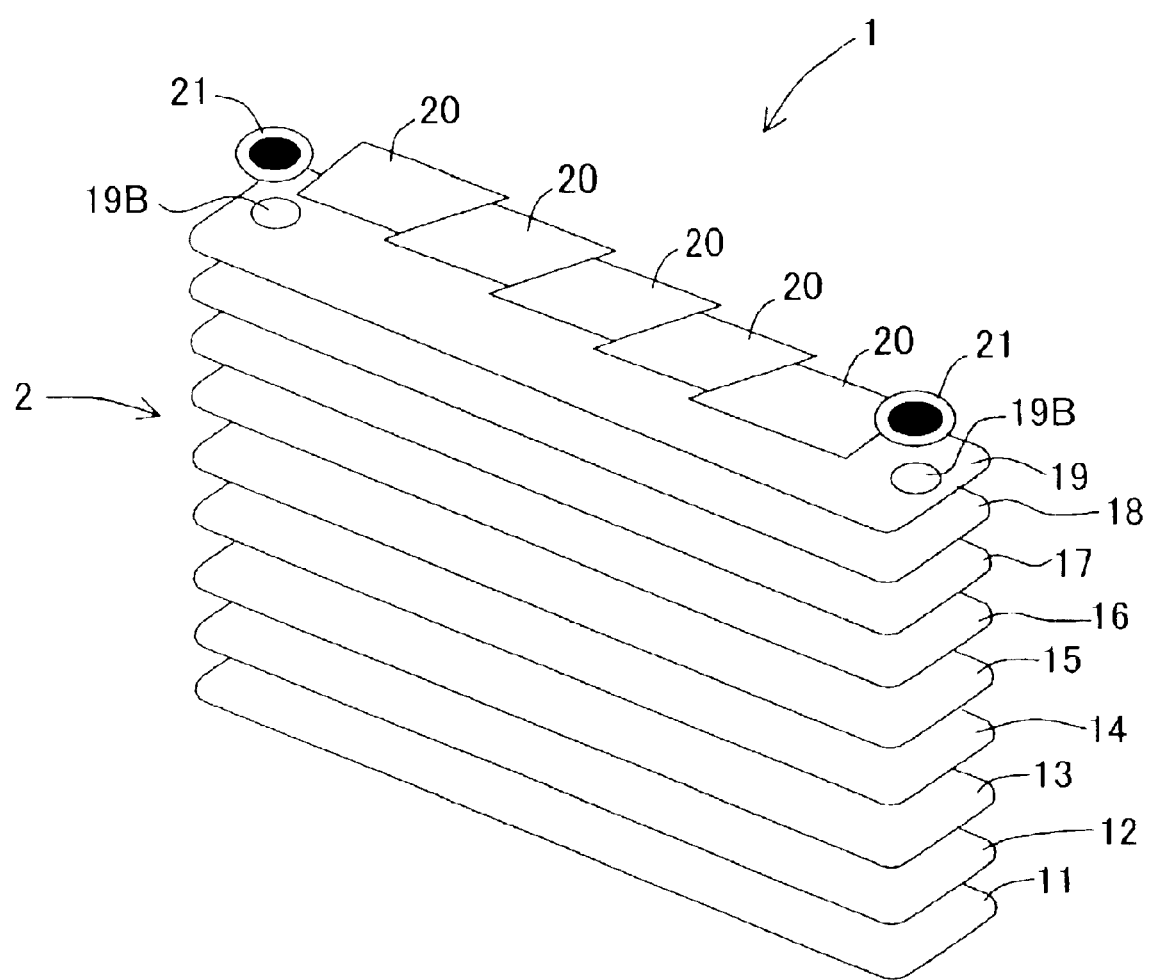
FIG. 4 shows an exploded perspective view illustrating an ink-jet printer head.
Figure 5:
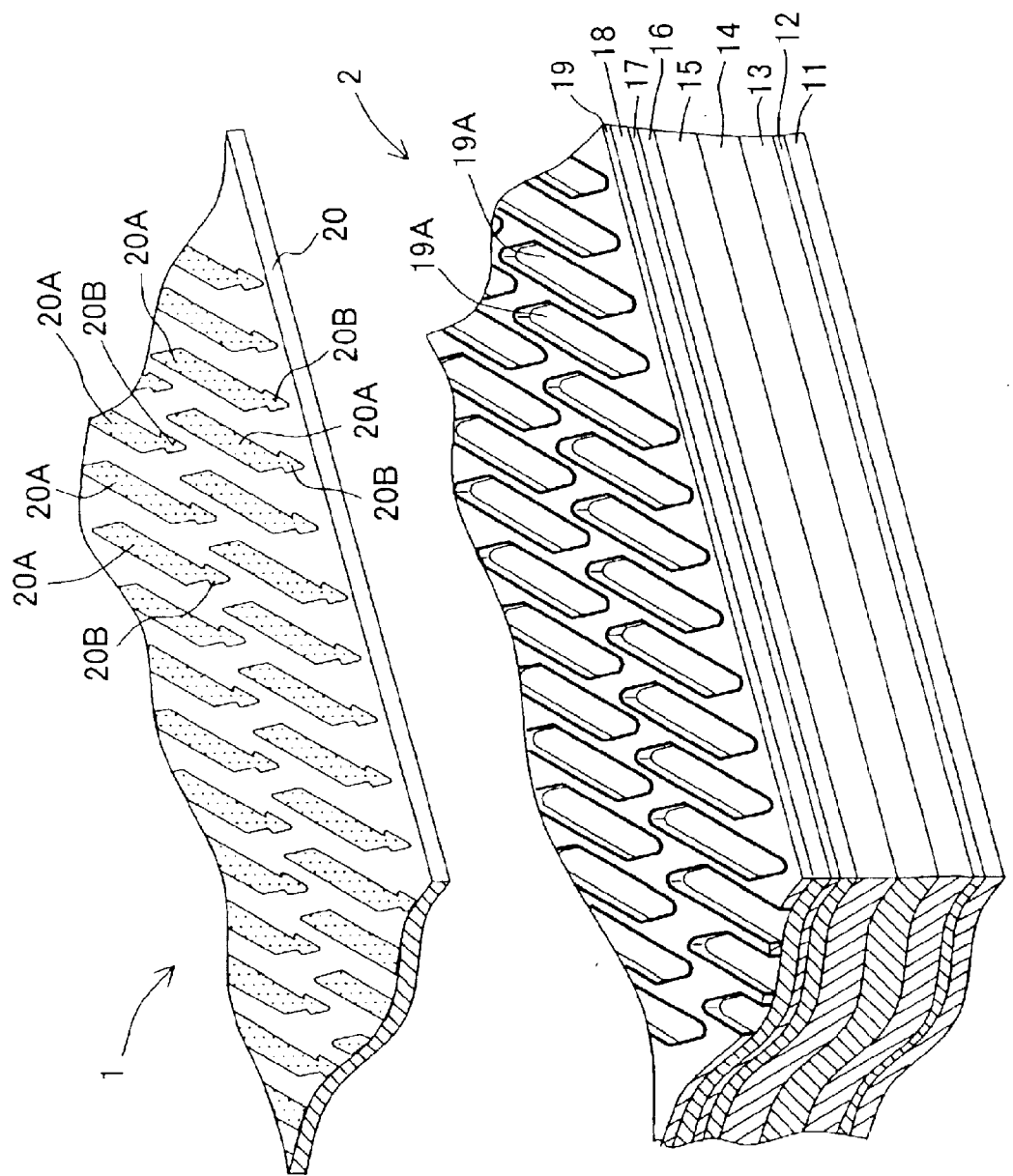
FIG. 5 shows an exploded perspective view illustrating major portions of a cavity plate and a piezoelectric sheet of the ink jet printer head.
Figure 6A:
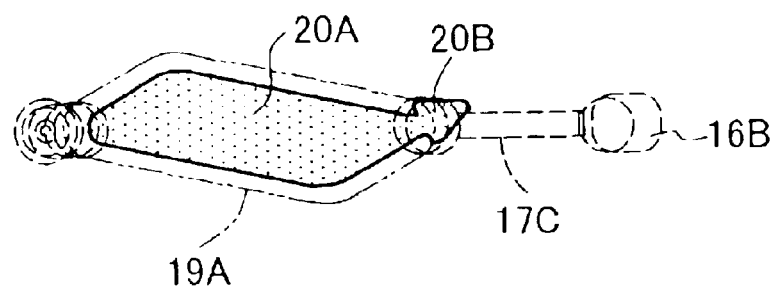
FIG. 6A shows a plan view.
Figure 6B:
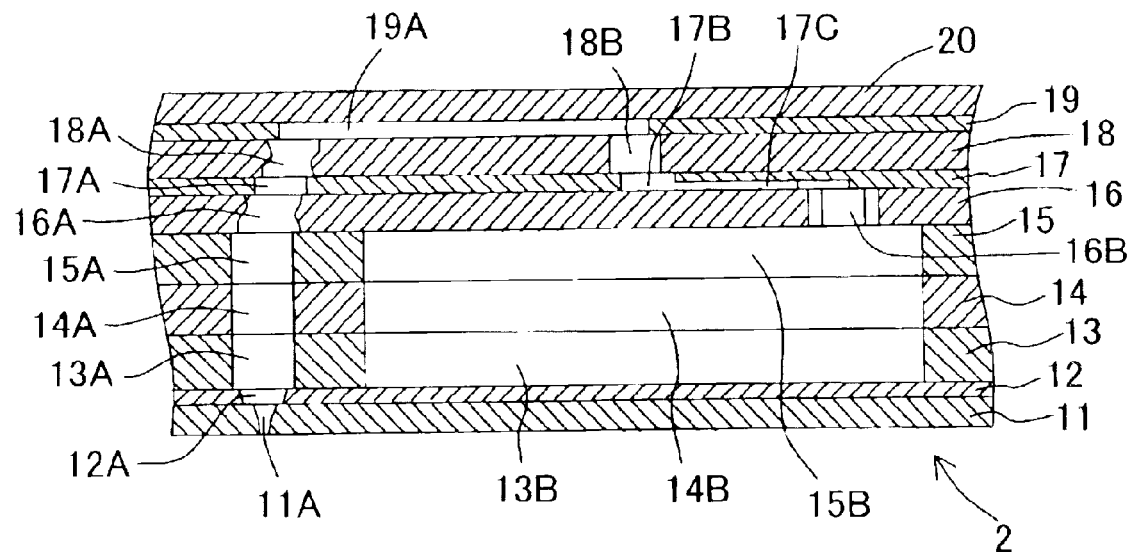
FIG. 6B shows a vertical sectional view.
Figure 7:
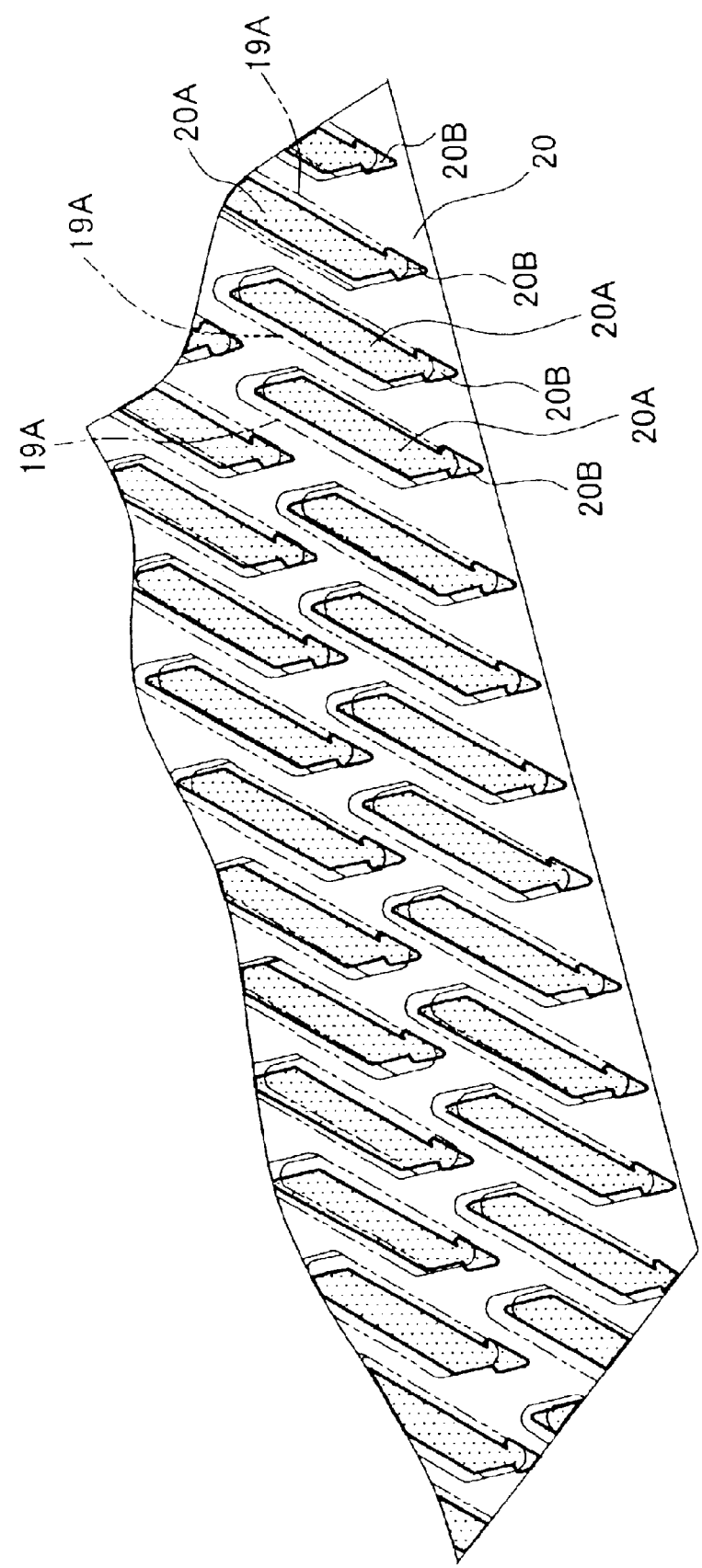
FIG. 7 shows a magnified perspective view of major portions schematically illustrating the structural arrangement of the driving electrodes formed on the piezoelectric sheet of the ink-jet printer head.

An explanation will now be made on the basis of FIGS. 4 to 7 about an example in which a piezoelectric sheet, which acts as a piezoelectric actuator for an ink-jet head, is formed of the piezoelectric ceramic composition prepared as described above, and the piezoelectric sheet is used for an ink-jet printer head. FIG. 4 shows an exploded perspective view illustrating the ink-jet printer head. FIG. 5 shows an exploded perspective view illustrating major portions of a cavity plate and the piezoelectric sheet of the ink-jet printer head. FIG. 6 shows schematic structures of a driving electrode and an ink pressure chamber of the ink-jet printer head, wherein FIG. 6A shows a plan view, and FIG. 6B shows a vertical sectional view. FIG. 7 shows a magnified perspective view of major portions schematically illustrating the structural arrangement of the driving electrodes formed on the piezoelectric sheet of the ink-jet printer head.

As shown in FIGS. 4 to 7, the ink-jet printer head 1 has such a structure that respective five plate-shaped piezoelectric sheets 20, 20, 20, 20, 20, which are substantially trapezoidal or substantially parallelogram-shaped as viewed in a plan view, are stacked in a mutually adjoining state on a cavity plate 2 which has a stacked structure composed of thin metal plates formed to be substantially rectangular. Ink pressure chambers 19A, which are formed to be substantially lozenge-shaped, are arranged in a plurality of arrays on the surface of the cavity plate 2 corresponding to the required printing density. The respective ink pressure chambers 19A in the plurality of arrays are arranged at a high density so that acute angle portions of the ink pressure chambers 19A mutually enter the spaces between the ink pressure chambers on other arrays.

The cavity plate 2 has a nine-layered structure in which nine plate members, which are composed of substantially rectangular metal plates, are stacked. Specifically, as shown in FIG. 6B, the cavity plate 2 has a structure obtained by stacking the nine thin metal plates, i.e., a nozzle plate 11, a cover plate 12, a first manifold plate 13, a second manifold plate 14, a third manifold plate 15, a supply plate 16, an aperture plate 17, a spacer plate 18, and a base plate 19 in this order from the bottom layer. As shown in FIG. 4, respective filter holes 19B, 19B, to which the ink is supplied, are formed at both end edge portions of the cavity plate 2 in the longitudinal direction. Respective filters 21, 21, through which a large number of fine through-holes are formed in order to prevent any invasion of dust contained in the ink, are stacked on the respective filter holes 19B, 19B.

As shown in FIGS. 6A and 6B, a large number of ink-jetting nozzles 11A, each of which has a minute diameter, are bored through the nozzle plate 11. A large number of through-holes 12A, which serve as ink passages having minute diameters communicating with the nozzles 11A, are bored through the cover plate 12 at positions opposed to the respective nozzles 11A. Further, the cover plate 12 constitutes one wall surface of the ink manifold passage formed by the respective manifold plates 13, 14, 15 as described later on.

A large number of through-holes 13A, which serve as ink passages having minute diameters communicating with the through-holes 12A, are bored through the first manifold plate 13 at positions opposed to the through-holes 12A. Further, groove-shaped holes 13B, which constitute the ink manifold passages, are formed in a plurality of arrays along the respective arrays of the respective ink pressure chambers 19A so that the groove-shaped holes 13B extend in the longitudinal direction.

A large number of through-holes 14A, which serve as ink passages having minute diameters communicating with the through-holes 13A, are bored through the second manifold plate 14 at positions opposed to the through-holes 13A. Further, groove-shaped holes 14B, which constitute the ink manifold passages, are formed in a plurality of arrays along the respective arrays of the respective ink pressure chambers 19A so that the groove-shaped holes 14B extend in the longitudinal direction.

A large number of through-holes 15A, which serve as ink passages having minute diameters communicating with the through-holes 14A, are bored through the third manifold plate 15 at positions opposed to the through-holes 14A. Further, groove-shaped holes 15B, which constitute the ink manifold passages, are formed in a plurality of arrays along the respective arrays of the respective ink pressure chambers 19A so that the groove-shaped holes 15B extend in the longitudinal direction.

A large number of through-holes 16A, which serve as ink passages having minute diameters communicating with the through-holes 15A, are bored through the supply plate 16 at positions opposed to the through-holes 15A. Further, a large number of through-holes 16B, which are communicated with the ink manifold passages to form the ink supply passages, are bored at positions in the vicinity of side end edges of the holes 15B (positions in the vicinity of right side end edges in FIG. 6B) in the diagonal direction opposingly to the acute angle portions of the ink pressure chambers 19A with respect to the through-holes 16A of the supply plate 16.

As shown in FIG. 6B, the ink manifold passages, which are constituted by the upper surface portions of the cover plate 12, the respective groove-shaped holes 13B, 14B, 15B, and the bottom surface portions of the supply plate 16 and which serve as common ink chambers for supplying the ink to the respective ink pressure chambers 19A, are formed in a plurality of arrays in the longitudinal direction.

A large number of through-holes 17A, which serve as ink passages having minute diameters communicating with the through-holes 16A, are bored through the aperture plate 17. Further, the aperture plate 17 has through-holes 17B which are bored at positions under the acute angle portions disposed on the ink supply side of the respective ink pressure chambers 19A. Further, aperture sections 17C, which are groove-shaped recesses, are formed on the bottom surface from the lower ends of the through-holes 17B to positions opposed to the through-holes 16B. The aperture sections 17C are formed as grooves each having a depth of about a half of the thickness of the aperture plate 17.

A large number of through-holes 18A, which are communicated with the respective through-holes 17A, are bored through the spacer plate 18. Further, through-holes 18B, which are communicated with the respective through-holes 17B, are bored through the spacer plate 18.

The large number of substantially lozenge-shaped ink pressure chambers 19A are formed through the base plate 19. The respective through-holes 18A, 18B, which are bored through the spacer plate 18, are arranged so that they are opposed to the respective acute angle portions of the ink pressure chambers 19A. The upper surfaces of the respective ink pressure chambers 19A are closed by the respective piezoelectric sheets 20, 20, 20, 20, 20 stacked thereon.

Driving electrodes 20A, which have substantially similar lozenge-shaped configurations slightly smaller than projected configurations of the lozenge-shaped ink pressure chambers 19A, are formed at positions corresponding to the respective ink pressure chambers 19A on the upper surfaces of the piezoelectric sheets 20. As shown in FIG. 6A, an arrow-shaped land pattern 20B is formed continuously to the acute angle portion of the driving electrode 20A corresponding to the acute angle portion disposed on the ink supply side of each of the ink pressure chambers 19A.

Figure 8:
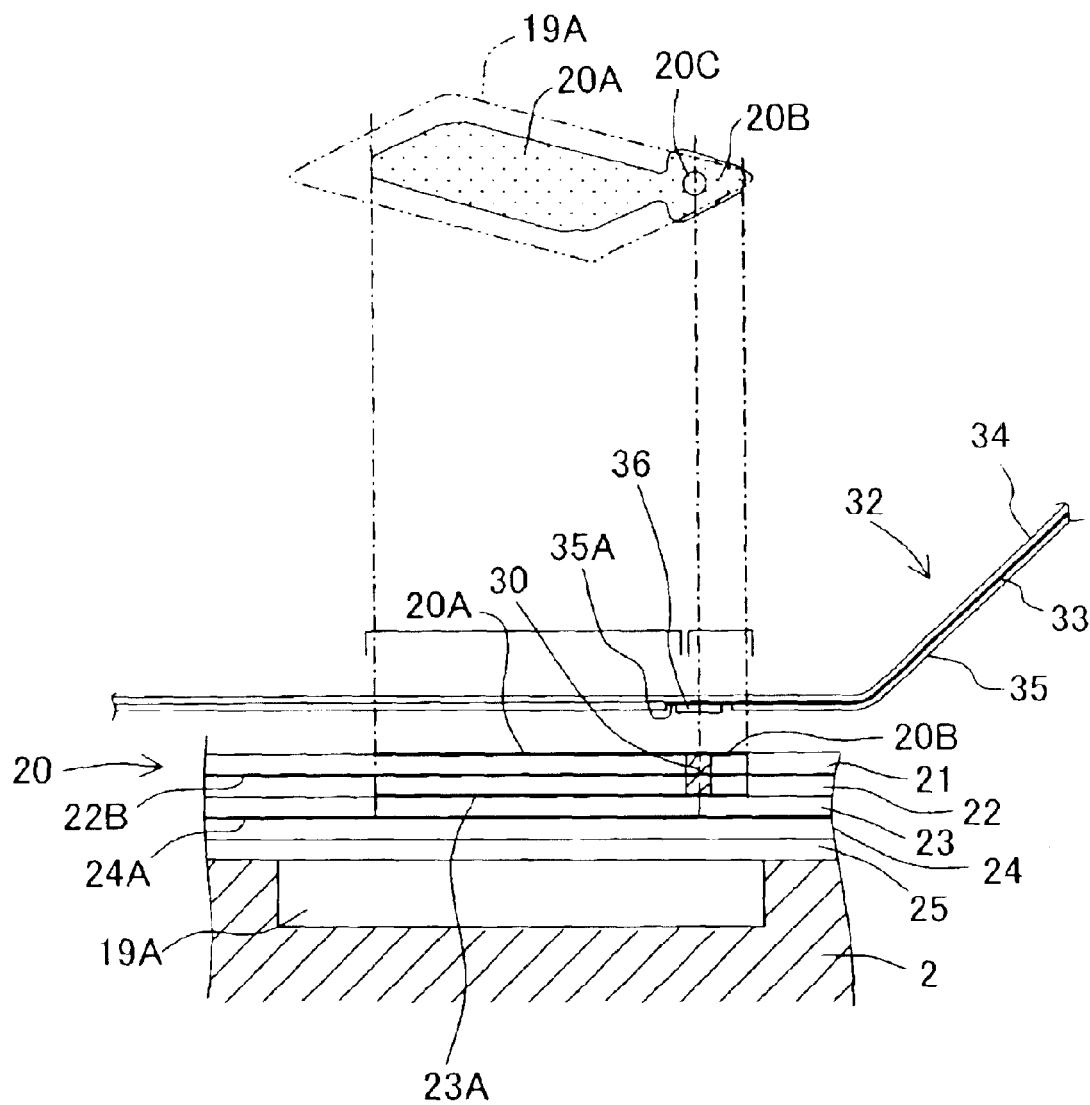
FIG. 8 shows a magnified vertical sectional view illustrating major portions of the piezoelectric sheet of the ink-jet printer head.
Figure 9:
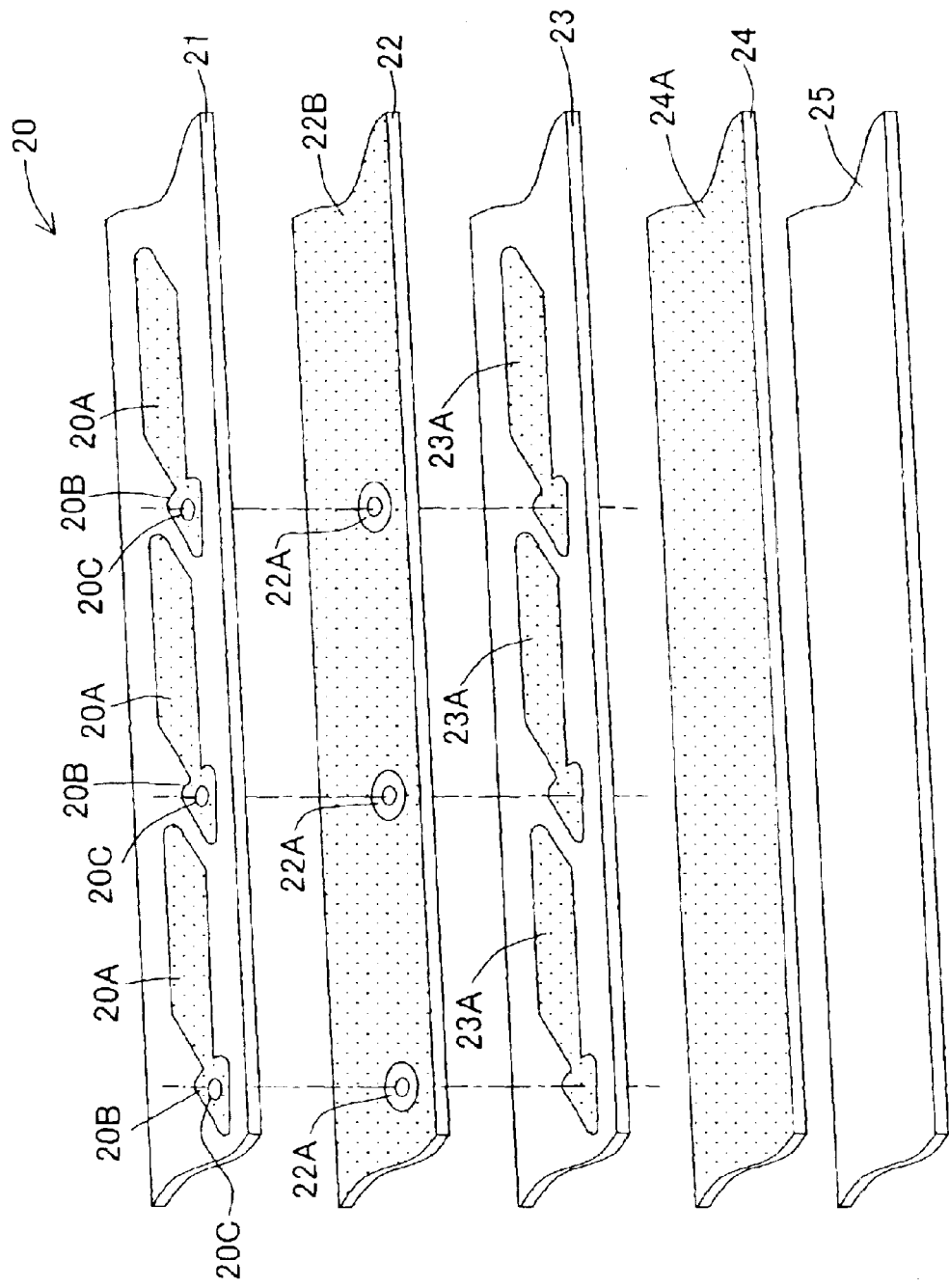
FIG. 9 shows an exploded perspective view schematically illustrating an electric connection structure in the piezoelectric sheet of the ink-jet printer head.

Next, an explanation will be made on the basis of FIGS. 8 and 9 about a schematic structure of the piezoelectric sheet 20 and an electric connection structure with respect to a flexible printed circuit board (FPC) provided to extend from a power source circuit unit (not shown). FIG. 8 shows a magnified vertical sectional view illustrating major portions of the piezoelectric sheet 20 of the ink-jet printer head 1. FIG. 9 shows an exploded perspective view schematically illustrating the electric connection structure in the piezoelectric sheet 20 of the ink-jet printer head 1.

As shown in FIGS. 8 and 9, the piezoelectric sheet 20 is formed to have such a structure that five layers, i.e., a first piezoelectric layer 21, a second piezoelectric layer 22, a third piezoelectric layer 23, a fourth piezoelectric layer 24, and a fifth piezoelectric layer 25 are stacked.

The substantially lozenge-shaped driving electrode 20A having an approximately similar shape slightly smaller than the projected shape of the ink pressure chamber 19A, and the arrow-shaped land pattern 20B formed continuously to the acute angle portion of the driving electrode 20A are formed at positions corresponding to each of the ink pressure chambers 19A as described above on the upper surface of the first piezoelectric layer 21. A through-hole 20C is bored through a substantially central portion of each of the land patterns 20B.

A large number of through-holes 22A are bored through the second piezoelectric layer 22 at positions opposed to the through-holes 20C. A common electrode 22B is formed on the substantially entire upper surface of the second piezoelectric layer 22 except for positions in the vicinity of upper end circumferential edge portions of the respective through-holes 22A. The common electrode 22B has its end which is formed to be exposed to the side surface end of the second piezoelectric layer 22.

A large number of internal electrodes 23A, which have approximately the same shapes as those of the driving electrodes 20A and the land patterns 20B, are formed at positions corresponding to the respective driving electrodes 20A and the land patterns 20B on the upper surface of the third piezoelectric layer 23.

A common electrode 24A is formed on the substantially entire upper surface of the fourth piezoelectric layer 24. The common electrode 24A has its end which is formed to be exposed to the side surface end of the fourth piezoelectric layer 24.

No electrode is formed on the upper surface of the fifth piezoelectric layer 25.

In this arrangement, the respective through-holes 20C of the first piezoelectric layer 21 are communicated with the respective through-holes 22A of the second piezoelectric layer 22 to form the respective through-holes 30. The respective through-holes 30 are filled with a conductive material (for example, tungsten or molybdenum). Accordingly, the respective land patterns 20B are electrically connected to the respective internal electrodes 23A via the through-holes 30.

As shown in FIG. 8, the flexible printed circuit board (FPC) 32, which is provided to extend from the unillustrated power source circuit unit, is arranged on the upper surface of the piezoelectric sheet 20. FPC 32 comprises conductor sections 33 which are composed of copper foils wired up to positions opposed to the respective land patterns 20B, a base film 34 which is bonded to the upper surfaces of the conductor sections 33, and a cover film 35 which is bonded to the lower surfaces of the conductor sections 33. A large number of through-holes 35A are bored at positions of the cover film 35 opposed to the respective land patterns 20B, i.e., at end edge portions of the respective conductor sections 33. Preparatory solder pieces 36, which are disposed to make the connection to the respective land patterns 20B, are formed at portions of the conductor sections 33 corresponding to the respective through-holes 35A.

Therefore, when the respective solder pieces 36 are overlapped with the respective land patterns 20B to effect the soldering, then the respective conductor sections 33 are joined to the land patterns 20B, and the respective conductor sections 33 are electrically connected to the respective internal electrodes 23A via the through-holes 30.

When the driving voltage is applied via FPC 32 between the driving electrode 20A of the first piezoelectric layer 21 and the internal electrode 23A of the third piezoelectric layer 23, and the common electrode 22B of the second piezoelectric layer 22 and the common electrode 24A of the fourth piezoelectric layer 24 of the first to fifth piezoelectric layers 21, 22, 23, 24, 25 constructed as described above, then the first to fifth piezoelectric layers 21, 22, 23, 24, 25 are deformed, and the pressure is successfully applied to the ink contained in the corresponding ink pressure chamber 19A of the cavity plate 2.

Therefore, each of the portions of the first to third piezoelectric layers 21, 22, 23, which corresponds to the driving electrode 20A and the internal electrode 23A, constitutes the active section which is flexibly bent when the voltage is applied. When the first to fifth piezoelectric layers 21, 22, 23, 24, 25 are sintered, the entire sheet may become warped or wavy in some cases, because the coefficient of contraction differs between the piezoelectric ceramics and the metal material for constructing the electrode when the sintering is performed. The fourth and fifth piezoelectric layers 24, 25 function as constraint layers in order that the flatness is not deteriorated for the first to fifth piezoelectric layers 21, 22, 23, 24, 25 as a result of the warpage or the wavy form after the sintering, and in order that the active sections of the first to third piezoelectric layers 21, 22, 23 are deformed in only the direction toward the ink pressure chamber 19A.

Next, the operation of the ink-jet printer head 1 constructed as described above will be explained on the basis of FIG. 6.

As shown in FIG. 6, the ink, which is supplied from the ink manifold passage constructed by the upper surface of the cover plate 12, the respective groove-shaped holes 13B, 14B, 15B, and the bottom surface of the supply plate 16, passes through the through-hole 16B, the aperture section 17C, the through-hole 17B, and the through-hole 18B, and the ink flows into the ink pressure chamber 19A. When the driving voltage is applied between the land pattern 20B and the respective common electrodes 22B, 24B by the aid of FPC 32, then the piezoelectric sheet 20 is deformed toward the ink pressure chamber 19A, and the ink contained in the ink pressure chamber 19A is extruded. The ink is discharged from the nozzle 11A via the respective through-holes 18A, 17A, 16A, 15A, 14A, 13A, 12A.

When the head was driven so as to control ink droplet speed to be 7 m/sec by using a conventional head-driving circuit for the ink-jet printer head 1 constructed as described above, the driving voltage was successfully lowered by about 35% as compared with a conventional case in which a printer head having the same structure as the ink-jet printer head except for piezoelectric layers being formed of conventional piezoelectric ceramic composition was used. The conventional piezoelectric composition has the piezoelectric displacement d33 of 600–650 pm/v. Accordingly, the piezoelectric sheet 20 (piezoelectric actuator for the ink-jet head) formed of the piezoelectric ceramic composition described above can be driven at a lower voltage. It is possible to miniaturize the head-driving circuit, and it is possible to increase the degree of freedom of the design of the head-driving circuit.

When the piezoelectric sheet 20 (piezoelectric actuator for the ink-jet head) formed of the piezoelectric ceramic composition described above is used, then the driving operation can be performed at a lower voltage, and it is possible to realize a small size of the head-driving circuit. In particular, when the piezoelectric sheet 20 is used, the displacement can be obtained as required even when the active section corresponding to the driving electrode 20A and the internal electrode 23A is narrowed. Accordingly, it is possible to make the head-driving circuit to be finer, and it is possible to realize a high density.

According to the piezoelectric ceramic composition described above the relative dielectric constant can be made to be relatively low within a range of 3550 to 1700. Therefore, the response characteristics are improved with respect to the input signal, and it is possible to perform the driving at a high speed. Further, it is possible to suppress any useless electric power consumption, and it is possible to increase the degree of freedom of the design of the head-driving circuit.

Figure 10:
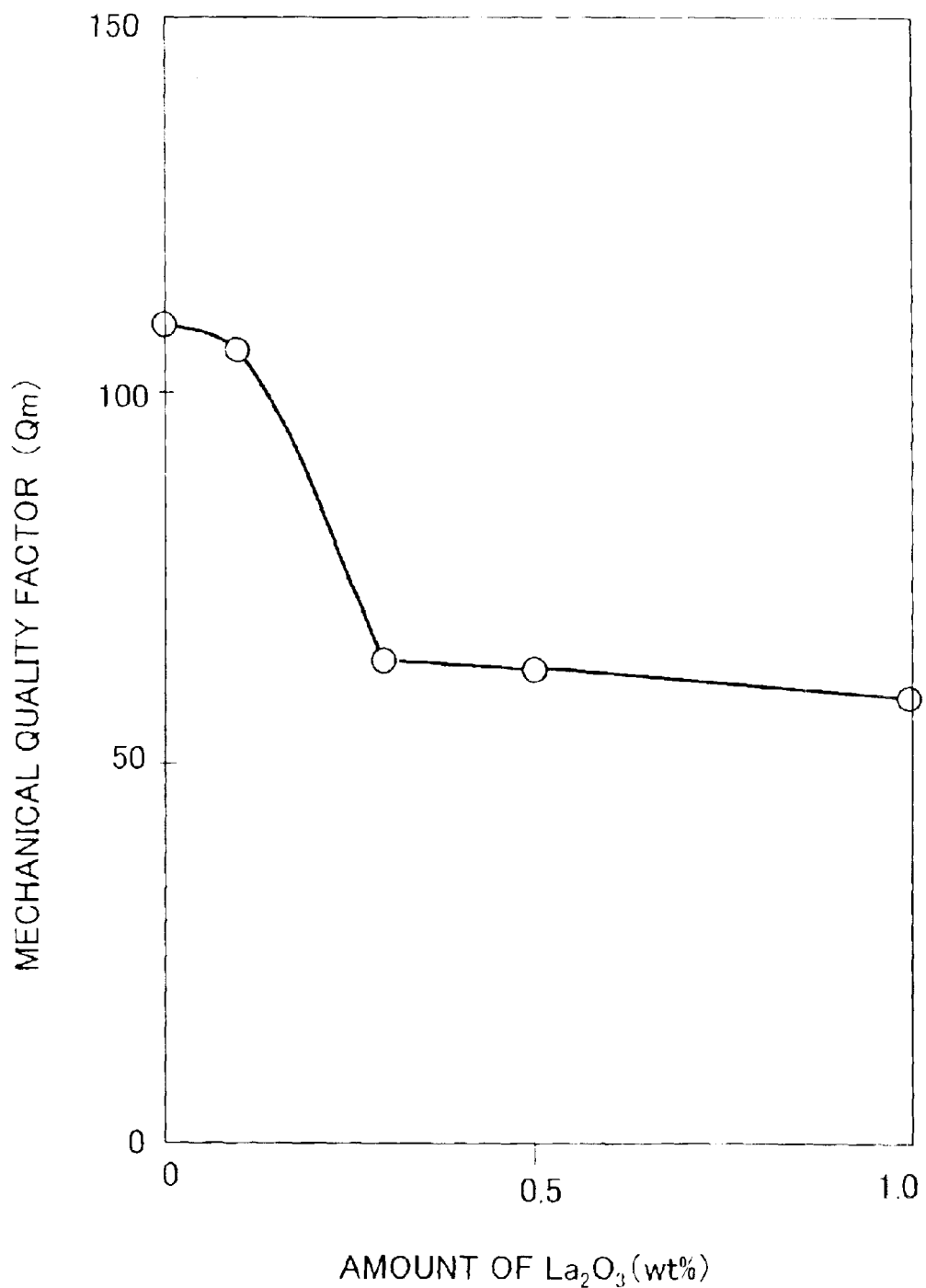
FIG. 10 shows a graph illustrating an effect of an additive when $La_2O_3$ is added to the piezoelectric ceramic composition.

Next, an explanation will be made on the basis of Table 1 and FIG. 10 about Example 2 of the piezoelectric ceramic composition. FIG. 10 shows a graph illustrating an effect of an additive when $La_2O_3$ is added to the piezoelectric ceramic composition. In FIG. 10, the vertical axis indicates the mechanical quality factor Qm, and the horizontal axis indicates the amount of addition of $La_2O_3$ (% by weight).

EXAMPLE 2

A piezoelectric ceramic composition according to Example 2 was prepared in the same manner as in Example 1 except that $La_2O_3$ as an additive was weighed and mixed in an objective amount based on the composition to be obtained after the sintering, in addition to lead oxide (PbO), nickel oxide (NiO), niobium oxide ($Nb_2O_5$), titanium oxide ($TiO_2$), and zirconium oxide ($ZrO_2$) as the starting materials, and the sintering was performed at 1260° C. for 3 hours when the respective materials were sintered.

The piezoelectric ceramic composition according to Example 2 is represented by Sample Nos. 40 to 43 shown in Table 1. The basic composition of PNN-PT-PZ was the composition including PNN of 37 molar %, PT of 38 molar %, and PZ of 25 molar % (Sample No. 25) in which the relatively high piezoelectric displacement d33 was obtained in the area surrounded by Point A, Point B, Point C, and Point D as described above, to which $La_2O_3$ was added by 0.1% by weight (Sample No. 40), 0.3% by weight (Sample No. 41), 0.5% by weight (Sample No. 42), and 1.0% by weight (Sample No. 43) respectively.

As clarified from Table 1, the values of the piezoelectric displacement d33, any one of which was not less than 750 pm/V as the threshold value, were measured in the same manner as described above for Sample 40 in which $La_2O_3$ was added by 0.1% by weight, Sample 41 in which $La_2O_3$ was added by 0.3% by weight, and Sample 42 in which $La_2O_3$ was added by 0.5% by weight. On the other hand, the value of the piezoelectric displacement d33, which was measured for Sample 43 in which $La_2O_3$ was added by 1.0% by weight, was 740 pm/V which was not more than the threshold value (750 pm/V).

The dielectric characteristics were measured for Samples 40 to 43 by using an impedance analyzer in the same manner as in Example 1. As a result, the relative dielectric constants at 1 kHz were 3100 to 3300 for Samples 40 to 42, but a relatively high value of 3700 was measured for Sample 43.

According to the above, the following fact is appreciated. That is, in the case of Samples 40 to 42, the large strain amount of not less than 750 pm/V can be realized for the piezoelectric displacement d33 while suppressing the relative dielectric constant to be low within the range of 3100 to 3300 in the same manner as in Example 1. However, in the case of Sample 43, the value of not more than the threshold value (750 pm/V) is merely obtained for the piezoelectric displacement d33, and the relative dielectric constant is relatively high, i.e., 3700. Therefore, Sample 43 is slightly inferior to Samples 40 to 42 in relation to the piezoelectric displacement d33 and the relative dielectric constant.

Further, as shown in FIG. 10, the relationship between the mechanical quality factor Qm and the amount of addition of $La_2O_3$ was measured for respective Samples 40 to 43. As a result, it is appreciated that the mechanical quality factor Qm is slightly lowered when the amount of addition of $La_2O_3$ is 0.1% by weight, and Qm is suddenly lowered when the amount of addition of $La_2O_3$ is increased up to 0.3% by weight. Further, it is appreciated that the decrease in mechanical quality factor Qm is extremely small even when the amount of addition of $La_2O_3$ is increased from 0.3% by weight to 0.5% by weight, and this tendency is scarcely changed even when the amount of addition of $La_2O_3$ is increased up to 1.0% by weight. Accordingly, when $La_2O_3$ is added to the piezoelectric ceramic composition, the mechanical quality factor Qm can be effectively lowered in a range in which the amount of addition is 0.1% by weight to 0.5% by weight. In particular, the mechanical quality factor Qm can be lowered more effectively when the amount of addition is in a range of 0.3% by weight to 0.5% by weight. When the mechanical quality factor Qm is low, for example, the resonance frequency approaches the antiresonance frequency, which is preferred for the way of use, for example, for actuators and sensors.

As described above, in the piezoelectric ceramic compositions corresponding to Samples 40 to 42 according to Example 2, $La_2O_3$ is added by 0.1% by weight to 0.5% by weight. Thus, the relative dielectric constant is suppressed to be low within the range of 3100 to 3300, and the mechanical quality factor Qm can be effectively lowered while maintaining the large strain amount of not less than 750 pm/V for the piezoelectric displacement d33.

A piezoelectric sheet to act as the piezoelectric actuator for the ink-jet head was formed of the piezoelectric ceramic composition according to Example 2 prepared as described above, and an ink-jet printer head, which was manufactured in the same manner as in Example 1 by using the piezoelectric sheet as described above, was subjected to the head driving by using the conventional head-driving circuit. As a result, the driving voltage was successfully lowered by about 35% as compared with the conventional technique. Accordingly, the piezoelectric sheet 20 (piezoelectric actuator for the ink-jet head), which is formed of the piezoelectric ceramic composition described above, can be driven at a lower voltage. It is possible to miniaturize the head-driving circuit, and it is possible to increase the degree of freedom of the design of the head-driving circuit.

When the piezoelectric sheet 20 (piezoelectric actuator for the ink-jet head), which is formed of the piezoelectric ceramic composition described above, is used, then the driving operation can be performed at a lower voltage, and it is possible to realize a small size of the head-driving circuit. In particular, when the piezoelectric sheet 20 is used, the displacement can be obtained as required even when the active section corresponding to the driving electrode 20A and the internal electrode 23A is narrowed. Accordingly, it is possible to make the head-driving circuit to be finer, and it is possible to realize a high density.

According to the piezoelectric ceramic composition described above, the relative dielectric constant can be made to be relatively low within a range of 3100 to 3300. Therefore, the response characteristics are improved with respect to the input signal, and it is possible to perform the driving at a high speed. Further, it is possible to suppress any useless electric power consumption, and it is possible to increase the degree of freedom of the design of the head-driving circuit.

The method for preparing the composition according to the present invention and the method for producing the actuator based on the use of the same have been specifically explained above. However, the present invention is not limited thereto, for which a variety of modifications and improvements can be made. For example, $La_2O_3$ is used as the additive in Example 2. Other than the above, it is also allowable to use, for example, Mn and lanthanum family elements including, for example, Tb, Eu, and Sm.

When the composition of the present invention is used, it is possible to realize a piezoelectric ceramic member which has a low relative dielectric constant and which has a large strain amount. The composition of the present invention is preferably usable, for example, for piezoelectric ceramic materials which are used, for example, for ultrasonic vibrators, piezoelectric relays, piezoelectric valves, flow rate sensors, acceleration sensors, and autofocusing lens actuators used for cameras and optical recording apparatuses. In particular, the composition of the present invention is preferably usable for stacked type piezoelectric element materials such as piezoelectric actuators for the ink-jet head.

What is claimed is:

1. A piezoelectric ceramic composition comprising $Pb(Ni_{1/3}Nb_{2/3})O_3$, $PbTiO_3$, and $PbZrO_3$, wherein:

a composition of $Pb(Ni_{1/3}Nb_{2/3})O_3$, $PbTiO_3$, and $PbZrO_3$ exists in an area in a triangular coordinate system defined by apexes of $Pb(Ni_{1/3}Nb_{2/3})O_3$, $PbTiO_3$, and $PbZrO_3$, the area being surrounded by lines for connecting a point A (X=40, Y=37, Z=23), a point B (X=36, Y=37, Z=27), a point C (X=33, Y=40, Z=27), and a point D (X=37, Y=40, Z=23), when $Pb(Ni_{1/3}Nb_{2/3})O_3$ amounts to X molar %, $PbTiO_3$ amounts to Y molar %, and $PbZrO_3$ amounts to Z molar % (X+Y+Z=100).

2. The piezoelectric ceramic composition according to claim 1, wherein the piezoelectric ceramic composition consists of $Pb(Ni_{1/3}Nb_{2/3})O_3$, $PbTiO_3$, and $PbZrO_3$.

3. The piezoelectric ceramic composition according to claim 1, wherein the composition of $Pb(Ni_{1/3}Nb_{2/3})O_3$, $PbTiO_3$, and $PbZrO_3$ exists in an area surrounded by lines for connecting a point E (X=38, Y=38, Z 24), a point F (X=36, Y=38, Z=26), a point G (X=35, Y=39, Z=26), and a point H (X=37, Y=39, Z=24).

4. The piezoelectric ceramic composition according to claim 1, wherein a piezoelectric displacement d33, which is obtained when a DC electric field of 1 kV/mm is applied in the same direction as that of a polarization axis of the piezoelectric ceramic composition, is not less than 750 pm/V.

5. The piezoelectric ceramic composition according to claim 1, wherein a relative dielectric constant at 1 kHz is within a range of 3550 to 1700.

6. An ink-jet head comprising the piezoelectric actuator as defined in claim 5 and a cavity plate.

7. The piezoelectric ceramic composition according to claim 1, further containing La in a ratio of 0.3 to 0.5% by weight as calculated by conversion into an oxide represented by $La_2O_3$.

8. A piezoelectric actuator which is formed of the piezoelectric ceramic composition as defined in claim 1.

* * * * *